US006897560B2

(12) United States Patent
Ota et al.

(10) Patent No.: US 6,897,560 B2
(45) Date of Patent: May 24, 2005

(54) ULTRAVIOLET-TRANSPARENT CONDUCTIVE FILM AND PROCESS FOR PRODUCING THE SAME

(75) Inventors: Hiromichi Ota, Kawasaki (JP); Masahiro Orita, Funabashi (JP); Hideo Hosono, Yamato (JP); Masahiro Hirano, Tokyo (JP)

(73) Assignee: Japan Science & Technology Corporation, Kawaguchi (JP)

( * ) Notice: Subject to any disclaimer, the term of this patent is extended or adjusted under 35 U.S.C. 154(b) by 109 days.

(21) Appl. No.: 10/311,352

(22) PCT Filed: Jul. 9, 2001

(86) PCT No.: PCT/JP01/05928

§ 371 (c)(1),
(2), (4) Date: Jan. 7, 2003

(87) PCT Pub. No.: WO02/05296

PCT Pub. Date: Jan. 17, 2002

(65) Prior Publication Data

US 2003/0107098 A1 Jun. 12, 2003

(30) Foreign Application Priority Data

Jul. 10, 2000 (JP) .......................... 2000-209139
Jun. 15, 2001 (JP) .......................... 2001-182643

(51) Int. Cl.[7] .............................................. H01L 23/48

(52) U.S. Cl. ................. 257/749; 257/518.1; 438/609

(58) Field of Search .................... 257/749; 252/518.1; 438/609

(56) References Cited

U.S. PATENT DOCUMENTS 5,652,062 A * 7/1997 Cava et al. .................. 428/426
5,955,178 A * 9/1999 Orita et al. .................. 428/210

FOREIGN PATENT DOCUMENTS

| JP | 7-118015 | 5/1995 |
| JP | 7-335030 | 12/1995 |
| JP | 9-259640 | 10/1997 |
| JP | 2000-90745 | 3/2000 |

OTHER PUBLICATIONS

N. Ueda et al.; Appl. Phys. Lett. vol. 70, No. 26, pp. 3561–3563; Jun. 30, 1997.

M. Orita et al.; Appl. Phys. Lett. vol. 77, No. 25, pp. 4166–4168; Dec. 18, 2000.

M. R. Lorenz et al.; J. Phys. Chem. Solids, vol. 28, pp. 403–404, Pergamon Press 1967.

M. Fleischer et al.; J. Appl. Phys., vol. 74, No. 1, pp. 300–305, Jul. 1, 1993.

M. Fleischer et al.; Metallurgical and Protective Layers, Thin Solid Films, 190, pp. 93–102, 1990.

J. Frank et al.; Sensors and Actuators B 49, pp. 110–114. Elsevier, 1998.

(Continued)

*Primary Examiner*—Jerome Jackson
(74) *Attorney, Agent, or Firm*—Westerman, Hattori, Daniels & Adrian, LLP

(57) ABSTRACT

The present invention provides an ultraviolet-transparent conductive film comprising a $Ga_2O_3$ crystal. The film has a transparency in the wavelength range of 240 to 800 nm, or 240 to 400 nm, and an electric conductivity induced by an oxygen deficiency or dopant in the $Ga_2O_3$ crystal. The dopant includes at least one element selected from the group consisting of the Sn, Ge, Si, Ti, Zr, Hf, V, Nb, Ta, Cr, Mo and W. The ultraviolet-transparent conductive film is formed through either one of a pulsed-laser deposition method, sputtering method, CVD method and MBE method, under the conditions with a substrate temperature of 600 to 1500° C. and an oxygen partial pressure of 0 to 1 Pa.

11 Claims, 1 Drawing Sheet

OTHER PUBLICATIONS

T. Omata et al.; Electrical and Optical Properties and Electronic Structure of $M^{2+}Ga_2O_4$ ($M^{2+}$=Zn, Cd).

T. Omata et al.; Appl.Phys. Lett. vol. 64, No. 9, pp. 1077–1081, Feb. 28, 1994.

Z. Yan et al.; J. Am. Ceram. Soc., vol. 81, No. 1, pp. 180–186, Jan. 1998.

R. Roy et al.; J. Amer. Chem. Soc. vol. 74, pp. 719–722, Feb. 5, 1952.

* cited by examiner

ULTRAVIOLET-TRANSPARENT CONDUCTIVE FILM AND PROCESS FOR PRODUCING THE SAME

TECHNICAL FIELD

The present invention relates to an ultraviolet-transparent conductive layer having a transparency in the wavelength range of the ultraviolet to visible region and therefore providing applicability to a transparent electrode or ultraviolet-transparent antistatic film for light-emitting devices or solar cells.

BACKGROUND ART

Heretofore, a transparent conductive film has been used as a transparent electrode for solar cells or flat panel displays. For these purposes, the transparent conductive film has been typically made of tin-doped iridium oxide (ITO), fluorine-doped tin oxide (FTO) or aluminum-doped zinc oxide (AZO), with particular emphasis on the transparency in the visible region of 400 to 800 nm. As another example, there have also been known non-crystalline transparent conductive films represented by $Ga_2O_3$ (Japanese Patent Laid-Open Publication No. 7-335030), $Ga_2O_2$—$In_2O_2$ (Japanese Patent Laid-Open Publication No. 9-259640), and $AB_{2-x}O_{4-y}$ (A: Mg, Cd, Zn etc., B: Al, In, Ga etc.).

These materials have a bandgap of about 3.2 eV or its equivalent wavelength of about 390 nm, and thereby does not allow transmission of near-ultraviolet light or deep-ultraviolet light having a wavelength shorter than the equivalent wavelength. In the context of no transparent conductive film having a bandgap greater than 5 eV (equivalent wavelength 250 nm) or a transparency in the wavelength range of 240 to 400 nm or 240 to 800 nm, the inventors have precedently developed a transparent conductive thin-film represented by a general formula $In_{2-x}Y_xO_3$+αwt % of $SnO_2$ or $In_{2-x}Y_xO_3$+αwt % of $Sb_2O_5$, which allows transmission of a light having a wavelength shorter than 400 nm (Japanese Patent Laid-Open Publication No. 2000-90745).

The potential applicability of $Ga_2O_3$ or $ZnGa_2O_4$ to ultraviolet-transparent conductive materials has been reported up to now. However, there has not been provided any report of verifying transparent conductivity in a thin-film form required for applications to transparent electrodes or antistatic films. The presence of a conductive property in $Ga_2O_3$ has been known from a long time ago, such as, in a report of Lowrenz et al. Lowrenz et al. verified 0.03 S/cm of conductivity in a single crystal prepared through a Bernoulli method under reduction atmosphere (Journal Physical Chemistry of Solids, Vol. 28, 1967, p 403).

Recently, Ueda et al. verified 38 S/cm of conductivity in a single crystal prepared through a floating zone method using a rod containing Sn added as a dopant (Applied Physics Letters, Vol. 70, 1997, p 3561). Further, based on a research of anisotropy in conductivity, Ueda et al. verified that $Ga_2O_3$ exhibits a higher conductivity in the b-axis direction of the crystal lattice. The b-axis direction means the direction of a line formed of oxygen octahedrons consisting of $GaO_6$, which are connected with each other in a chain structure while sharing their edges. The bandgap in the b-axis direction was 4.79 eV, and a single crystal sample of 0.32 mm thickness exhibited a light transmittance of 20% with respect to a light of 266 nm wavelength. Ueda et al. believe that the $Ga_2O_3$ single crystal has a capability of allowing transmission of a KrF excimer laser beam.

The conductive property of $Ga_2O_3$ has been methodically studied by Fleischer et al. Fleischer et al prepared a $Ga_2O_3$ thin-film through a sputtering method using a high-purity $Ga_2O_3$ target and at a substrate temperature of 500° C. (Thin Solid Films, Vol. 190, 1990, p 93). Fleischer et al. measured 10 kΩ of electric resistance at 1000° C. in the prepared thin-film of 1 μm thickness. Its conductivity was about 0.3 S/cm at 1000° C., but it went down to 0.01 S/cm at a lowered temperature of 800° C. No conductive property has been verified at room temperature.

In Journal of Applied Physics, Vol. 74, 1993, p 300, Fleischer et al. reported that $Ga_2O_3$ has a carrier mobility of about 10 $cm^2$/Vs at 1000° C. based on a research of an electric conduction mechanism of $Ga_2O_3$ in a temperature range of 800 to 1000° C. However, this report does not mention any conductive property at room temperature.

Recently, Fleischer et al. obtained double-digit increased conductivity by using $SnO_2$ as a dopant (Sensors and Actuators B Vol. 49, 1998, p 110). A thin film was formed through a magnetron sputtering method using a high-purity ceramic target, and then the film was crystallized through a heat treatment at 1050° C. for 10 hours. The thickness of the thin film was from 50 to 200 nm, and the lowest resistance, specifically about 0.5 kΩ at 900° C. and about 100 kΩ at 600° C., was obtained by adding $SnO_2$ at 0.5 mol %.

While this report includes no description of conductivity, this thin film would have a conductivity of about 10 S/cm in view of $10^{20}$/$cm^2$ of carrier density at 800° C. in this report and 10 $cm^2$/Vs of carrier mobility in the previous report. However, all of these values are measured in a high temperature range of 600° C. or more, and this report does not mention any conductivity at room temperature just as the previous report. Further, this report describes neither transparency nor applicability to transparent conductive films.

Omata et al. reported that $ZnGa_2O_4$ exhibits 30 S/cm of conductivity and has an absorption edge at 250 nm (The Ceramic Society of Japan, preliminary reports of Seminar '93, p 585). Omata et al. made a detailed report in "Applied Physics Letters, Vol. 64, p 1077, 1994". According to this report, a sample was a sintered body prepared by mixing ZnO and $Ga_2O_3$ powders, pre-burning the mixed power at 1000° C. for 24 hours, pressingly shaping the pre-heated power into a disc-shaped body, and heating the disc-shaped body at 1300° C. for 48 hours. This sample exhibited no conductive property.

The sample was then subjected to an annealing treatment at 700° C. under hydrogen atmosphere. The resulting sample has 30 S/cm of electric conductivity. An absorption edge wavelength was determined from a diffuse reflectance spectrum of the sintered-body sample. As above, this report shows neither conductive property verified in a thin-film sample nor transparency verified by measuring a transmittance spectrum.

Kawazoe, coauthor of this article, studied more detail and made a report in "Journal of American Ceramic Society, Vol. 81, 1998, p 180". According to this report, a $ZnGa_2O_4$ thin-film was prepared through a sputtering method. The resulting $ZnGa_2O_4$ thin-film was insulative, and no film having a conductive property was obtained. A sample formed as a single crystal was also insulative, and it had a conductive property only after a heat treatment at 600° C. under hydrogen atmosphere. However, the conductive property was verified only at a surface layer having a depth of about 50 μm from the surface of the single crystal, and the inside of the single crystal was still insulative.

In an analysis using a transmission microscope, the above surface layer had a modified crystal structure, specifically a trigonal crystal type ordered halite structure represented by $2(Zn_{0.5}GaO_2)$ modified from its original spinel type $ZnGa_2O_4$. This would be caused by vaporization of oxygen together with Zn in the heat treatment under hydrogen atmosphere. It is presumed that the crystal structure in the surface of the sintered-body sample prepared by Omata et al. must be changed into a trigonal crystal type ordered halite structure because the sample was also subjected to the heat treatment under hydrogen atmosphere.

The inventors have precedently proposed a material represented by a general formula $Zn(Ga_{(1-x)}Al_x)_2O_4$ or a solid solution of a spinel type crystal structure, which exhibits a conductive property and a transparency to a light having a wavelength of 250 nm or less. However, there is no prior art disclosing a $ZnGa_2O_4$ thin-film having transparent conductivity.

(Problem to be Solved by the Invention)

In late years, a light-emitting material and device having a function of emitting blue light or ultraviolet light and a solar cell for converting sunlight into electric power has been increasingly used in society. In these electronic devices, a transparent electrode is one of essential elements, and the Indium Tin Oxide (ITO) and Antimony doped Tin Oxide (ATO) are used in light-emitting devices and solar cells, respectively. However, neither the ITO nor the ATO allows sufficient transmission of a blue light having a wavelength of about 400 nm and an ultraviolet light having a wavelength shorter than the blue light. Thus, if the thickness of the transparent electrode is increased, the light-emitting devices will have a significantly reduced light-emitting efficiency. In addition, the solar cells cannot pick up any ultraviolet light from sunlight. Further, no antistatic film allowing transmission of ultraviolet light has been developed.

A halftone layer has been made of a substance having no conductive property. A phase-shift mask is prepared by covering a part of the surface of the mask with the halftone layer, which can fabricate a resist pattern with a resolution of a half of an irradiated light wavelength. The light transmittance of the halftone layer to the irradiated light is reduced down to about 4 to 20%, and is operable to shift the phase of the irradiated light by half-wavelength. Thus, the phase of the light after passing through the halftone layer is shifted by half-wavelength as compared to the light before passing therethrough. Interference of the two beams provides significantly enhanced resolution of the pattern.

The halftone layer is prepared by uniformly forming a film on the surface of a glass substrate and then patterning through an electron-beam lithography. Since the conventional halftone layer had no conductive property, electrostatic charge due to irradiated electrons during the electron-beam lithography has been prevented by applying a conductive organic material onto the surface of the halftone layer or by incorporating a conductive material such as $SnO_2$ in the halftone layer. If an ultraviolet-transparent conductive film is used as a material for forming the half tone layer, the process of applying the organic material can be omitted, and the structure of the halftone layer can be simplified.

A concept "Lab-on-a-Chip" is one of research tasks actively addressed recently. In this concept, a micro cell formed in the surface of a Si substrate or a $SiO_2$ glass substrate is used as a reaction vessel or analytical vessel, i.e. a micro experimental system. Various related researches are driving forward, particularly for the purpose of synthesization and/or analysis of organic molecules such as DNAs, protein molecules, medical agents and photoelectron functional organic molecules.

Generally, these organic molecules are activated by an ultraviolet light having a wavelength of about 300 nm. Thus, it is important to irradiate the organic molecules with an ultraviolet light while applying an electric field thereto or to detect a resulting ultraviolet emission. However, there has not been developed any ultraviolet-transparent conductive film usable for this purpose. If such a suitable ultraviolet-transparent conductive film is achieved, it can be effectively used as a transparent electrode in devices such as the Lab-on-a-Chip for synthesizing and/or analyzing DNAs, protein molecules or other organic molecules.

DISCLOSURE OF THE INVENTION

As mentioned above, the applicability of $Ga_2O_3$ or $ZnGa_2O_4$ to transparent conductive materials has been verified based on single-crystal and polycrystal samples, but it has not been achieved to prepare them as a thin-film and provide an effective transparent conductivity in the thin film. The inventors have found that a substrate temperature arranged at 600 to 1500° C. during film formation allows oxygen deficiency to be formed in a $Ga_2O_3$ crystal or allows Sn ion serving as a dopant to be introduced into a $Ga_2O_3$ crystal, which makes it possible to form a thin film having a transparent conductivity.

Specifically, the present invention provides an ultraviolet-transparent conductive film comprising a $Ga_2O_3$ crystal, and having a transparency in the wavelength range of 240 to 800 nm and an electric conductivity induced by an oxygen deficiency or dopant incorporated in the $Ga_2O_3$ crystal.

The present invention also provides an ultraviolet-transparent conductive film comprising a $Ga_2O_3$ crystal, and having a transparency in the wavelength range of 240 to 400 nm and an electric conductivity induced by an oxygen deficiency or dopant incorporated in the $Ga_2O_3$ crystal.

In the above ultraviolet-transparent conductive film, the dopant may include at least one element selected from the group consisting of the Sn, Ge, Si, Ti, Zr, Hf, V, Nb, Ta, Cr, Mo and W.

Further, the above ultraviolet-transparent conductive film may have a light transmittance at a wavelength of 248 nm may be 4% or more, preferably 15% or more, more preferably 30% or more.

The present invention also provides a method of preparing an ultraviolet-transparent conductive film comprising a $Ga_2O_3$ crystal, characterized by forming the film through either one of a pulsed-laser deposition method, sputtering method, CVD method and MBE method, under the conditions with a substrate temperature of 600 to 1500° C. and an oxygen partial pressure of 0 to 1 Pa.

Further, the present invention provides a method of preparing an ultraviolet-transparent conductive film comprising a $Ga_2O_3$ crystal, characterized by forming the film through either one of a pulsed-laser deposition method, sputtering method, CVD method and MBE method, under the conditions with a substrate temperature of less than 600° C. and an oxygen partial pressure of 0 to 1 Pa while adding an energy other than thermal energy to the substrate or removing undesirable surface adsorbates from the substrate.

It is known that $Ga_2O_3$ has five phases ($\alpha$, $\beta$, $\gamma$, $\epsilon$, $\delta$) of crystal structures, and the stable phase of $Ga_2O_3$ at normal temperature and pressure is the $\beta$ phase. The $\alpha$ phase is obtained under high pressure. It is reported that the $\gamma$, $\epsilon$, and $\delta$ phases are deposited when $Ga_2O_3$ is synthesized through a wet process (R. Roy, V. G. Hill and E. F. Osborn, J. Amer. Chem. Soc., 74 (1952) 719). In each of the crystal phases, Ga ions form polyhedrons of $GaO_4$ or $GaO_6$ which are connected with each other in a chain structure. Thus, a carrier electron can be injected into the crystal lattice to induce an electric conductivity therein.

While a thin film is usually formed as the β phase, the α phase or high-pressure phase might be formed, for example, by using an appropriate single-crystal substrate and producing a stress in the thin film. As compared to the β phase, the α phase has a shorter distance between the adjacent Ga ions and a higher symmetry in crystal structure. Thus, the α phase can provide an ultraviolet-transparent conductive film having a high electric conductivity without anisotropy.

In a $Ga_2O_3$ crystal as a material of the ultraviolet-transparent conductive film of the present invention, it is required for Ga ions to form polyhedrons of $GaO_4$ or $GaO_6$ which are connected with each other in a chain structure while sharing their apexes or edges. Because the electric conductivity in the crystal can be provided only if the respective 4 s orbitals of the Ga ions aligned in a chain structure are superimposed so as to form a conduction band.

The ultraviolet-transparent conductive film of the present invention has a transparency in the wavelength range of 240 to 400 nm, or 240 to 800 nm. In terms of the transparent wavelength range, if only the transparency to deep/near-ultraviolet light is important, the transparency in the wavelength rage of 400 to 800 nm will be unnecessary, and the transparent wavelength range may be from 240 to 400 nm. However, the film having a transparency to all of the deep/near-ultraviolet and visible lights or in the entire wavelength range of 240 to 800 nm is also useful.

Generally, lights having the wavelength ranges of 800 to 400 nm, 400 to 300 nm and 300 to 200 nm are referred to as visible light, near-ultraviolet light and deep-ultraviolet light, respectively. When a transparent electrode is applied to devices subject to the transparency in the entire visible region, such as light-emitting devices or full-color displays, in order to provide an enhanced transparency to blue light as compared to the conventional ITO film, it is required to have a transparency in a wavelength range of 380 to 800 nm, or a transparency to the near-ultraviolet region in addition to the entire visible region. The same goes for a transparent electrode to be applied to solar cells in order to utilize the deep/near-ultraviolet light in addition to the visible light.

The limit of the transparency of a transparent conductive film at the long-wavelength edge generally is determined by plasma absorption due to a carrier introduced into the transparent conductive film, because the plasma absorption (due to the carrier) is caused in the near-infra red region. The wavelength causing the plasma absorption is shifted toward a shorter wavelength as the density of the carrier is increased. Thus, when it is required to have a transparency in a wavelength range of 240 to 800 nm, the carrier density should be controlled so as to prevent the plasma absorption from arising in the wavelength of 800 nm or less. The plasma absorption can be readily measured by a spectrophotometer.

On the other hand, some device requires only the transparency in the deep/near-ultraviolet region but not in the visible region. For example, if it is required to allow transmission only of a light from a near-ultraviolet-light-emitting device such as GaN or ZnO diodes, a mercury lamp, a deuterium lamp, a third harmonics of YAS laser an XeF excimer laser beam, or a KrF excimer laser beam, a higher-density carrier can be introduced to provide enhanced conductive property, at sacrifice of the transparency in the visible region. In this case, the carrier density may be controlled so as to prevent the plasma absorption from arising in the wavelength of 400 nm or less. That is, the conductivity of an ultraviolet-transparent conductive film having a transparency in a wavelength range of 240 to 400 nm can be enhanced, compared to the film having a transparency in a wavelength range of 240 to 800 nm.

The transparency is determined from a transmittance spectrum, for example, by using an ultraviolet/visual spectrophotometer. Specifically, the intensity of a transmitted light is measured while placing an ultraviolet-transparent conductive film on a substrate in a position allowing light from the spectrophotometer to be incident perpendicular to the film. The substrate is used as a reference sample. The ratio of the intensity of the transmitted light to the intensity of the incident light is defined as a light transmittance.

The ultraviolet-transparent conductive film of the present invention has a light transmittance of 4% or more, preferably 15% or more, more preferably 30% or more, particularly 80% or more. When the film is used as an transparent electrode for ultraviolet-light-emitting devices or solar cells, a suitable light transmittance may be 80% or more.

The ultraviolet-transparent conductive film is used in the field of utilizing ultraviolet light. For example, the film is used as an high-efficient transparent electrode for blue-light-emitting materials or ultraviolet-light-emitting materials. If the film is used as a transparent electrode for solar cells, ultraviolet light in the sunlight can be effectively converted into electric energy. The ultraviolet-transparent conductive film can also be applied to an antistatic film on a photomask used in a photo-lithography process. In this case, a suitable light transmittance may be from 4 to 20%.

In an experimental test for measuring the properties of an organic material or testing sample while irradiating it with ultraviolet light, the ultraviolet-transparent conductive film is effective to prevent electrostatic charge in the substrate surface or the like. In processing technologies using an ultraviolet laser, it is advantageous to prevent electrostatic charge in the surface of a material to be processed. In this case, a transparent conductive film allowing transmission of a light of 248 nm wavelength can be applied to a process using a KrF excimer laser beam.

Figure 1:
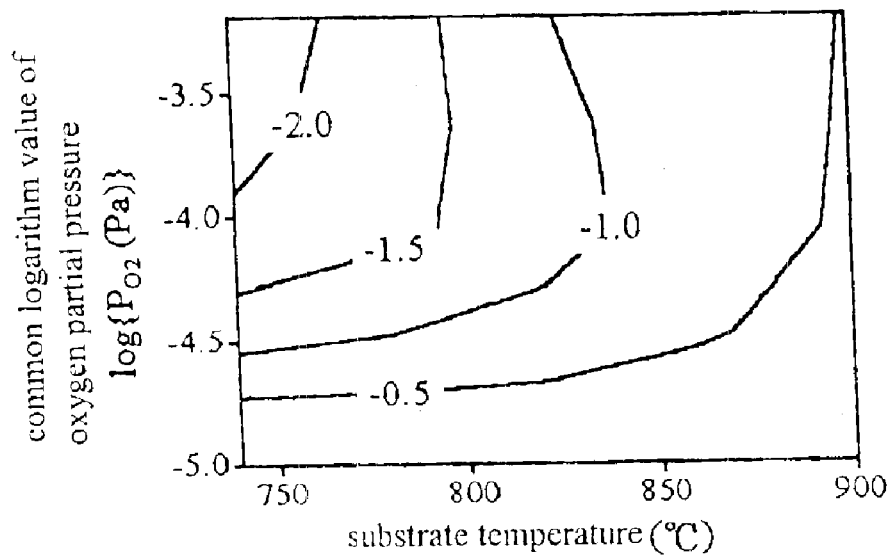
FIG. 1 is a contour diagram showing a conductivity of a $Ga_2O_3$ thin-film obtained from Example 4.

BEST MODE FOR CARRYING OUT THE INVENTION $Ga_2O_3$ is used as a material of the ultraviolet-transparent conductive film of the present invention. The conductive property of the $Ga_2O_3$ crystal is created by incorporating an oxygen deficiency or a dopant element into the $Ga_2O_3$ crystal. The $Ga_2O_3$ crystal as a intrinsic form is an insulator or nonconductor. When oxygen deficiencies are incorporated into the crystal, two electrons are created with respect to each of the oxygen deficiencies. On the other hand, dopant elements are incorporated into the crystal, a few electrons are created with respect to each of the dopant elements or atoms, depending on the valence of the incorporated dopant element. The created electrons occupy a conduction band and serve as electric conductive carriers.

The optical bandgap of β-$Ga_2O_3$ has is 4.9 eV which is equivalent to a light wavelength of 250 nm. Thus, β-$Ga_2O_3$ allows transmission of the deep-ultraviolet, near-ultraviolet and visible lights falling within the wavelength range of 250 nm or more. On the other hand, β-Ga$_2$O$_3$ has a sharply reduced light transmittance in the wavelength range of less than 250 nm and thereby provides only a small light transmittance at 248 nm which is a wavelength of the KrF excimer laser. However, in the present invention, carrier electrons are injected into a conduction band to give a conductive property to β-Ga$_2$O$_3$. Thus, the optical bandgap is slightly expanded according to the Burstein-Moss effect, and the light absorption edge is shifted toward a shorter wavelength to provide an increased light transmittance at 248 nm. In addition, by increasing the density of the carrier electrons, the light absorption edge can be further shifted to shorter wavelength to allow transmission of a light having shorter wavelength.

The bandgap may be effectively expanded through a method of incorporating a substance such as Al$_2$O$_3$ having a wider bandgap than β-Ga$_2$O$_3$ into the lattice of β-Ga$_2$O$_3$ as a solid solution. However, it should be considered that the solid solution could make it difficult to inject carrier electrons or act as a scattering center of the carrier electrons to cause deterioration in electric conductive property.

In case of using a pulsed-laser deposition method or a sputtering method, the dopant element may be contained in a target. For example, when 3 mol % of SnO$_2$ is added to Ga$_2$O$_3$ as a dopant, a ceramics target can be prepared by checkweighting a Ga$_2$O$_3$ powder and a SnO$_2$ power to mix them at a mol ratio of Ga$_2$O$_3$1:SnO$_2$0.03, pre-annealing the mixed powder at 1000° C. for 5 hours, shaping the pre-annealed powder into a disc-shaped body, and annealing the disc-shaped body at 1500° C. for 2 hours.

In case of using a CVD method or a MO-CVD, an individual gas line is prepared in advance, and the dopant element may be supplied into a reaction vessel through the gas line. The amount of the dopant element to be added is controlled by adjusting the inflow of the dopant element. In case of using a MBE method, an individual evaporation cell is prepared in advance, and the dopant material may be emitted from the evaporation cell onto a substrate. The amount of the dopant to be added is controlled by adjusting the dose of the dopant beam.

The dopant element may be a metal ion having a valence greater than that of a metal ion constituting a Ga$_2$O$_3$ crystal. For example, a Ga ion has a valency of three, and thereby the dopant element may be a metal ion having a valent of four or more. Specifically, the dopant element includes Sn$^{4+}$, Ge$^{4+}$, Si$^{4+}$, Ti$^{4+}$, Zr$^{4+}$, Hf$^{4+}$, V$^{5+}$, Nd$^{5+}$, Ta$^{5+}$, Cr$^{6+}$, Mo$^{6+}$, and W$^{6+}$. Some of these metals can have another valency. It is to be understood that the present invention is not limited to the above metal ions as an example, but any other metal ions of four or more may be use.

Preferably, the pulsed-laser deposition method is used as a method of preparing the ultraviolet-transparent conductive film of the present invention. The sputtering method, CVD method, MO-CVD method or MBE method may also be used. In either film-forming method, a substrate temperature is preferably set in the range of 600 to 1500° C. At a substrate temperature of less than 600° C., no oxygen deficiency is created in the Ga$_2$O$_3$ crystal, and consequently the film cannot have any conductive property. In this case, even if the dopant is added, no dopant ion is incorporated into the crystal as a solid solution, and consequently the film cannot have any conductive property.

If the substrate temperature is greater than 1500° C., the vapor pressure of Ga$_2$O$_3$ components goes up to preclude any deposit to be formed on the substrate. As the substrate temperature is increased, the vapor pressure of β-Ga$_2$O$_3$ goes up, and the deposited β-Ga$_2$O$_3$ tends to evaporate so as to slow down the deposition rate and provide deterioration in surface roughness of the deposit film. From this standpoint, more preferably, the substrate temperature is set in the range of 700 to 1100° C. An oxygen partial pressure is set in the range of 0 to 1 Pa. If the oxygen partial pressure is greater than 1 Pa, no oxygen deficiency is created in the Ga$_2$O$_3$ film, and consequently the film cannot have any conductive property. Even if the dopant is added, no dopant ion is incorporated into the crystal, and consequently the film cannot have any conductive property.

A silica glass substrate and various crystalline substrates may be used in the method of the present invention. While the silica glass substrate is desirable in terms of high workability for forming a flat surface and availability at low cost, it cannot be heated at 1200° C. or more during film formation process because its melting point is not so high. The crystalline substrate may include YSZ, Al$_2$O$_3$ (sapphire), MgO, CaF$_2$, Si and SiO.

When the ultraviolet-transparent conductive film is used as a transparent electrode in the ultraviolet range, the substrate should also be transparent. Thus, a substrate such as YSZ, Al$_2$O$_3$ (sapphire), MgO and CaF$_2$ is suitable for this purpose. Particularly, a sapphire substrate having a large diameter such as 6 inch is commercially available. On the other hand, when used as an electrode for ultraviolet-light-emitting devices, the substrate desirably has a conductive property. Thus, a semiconductor substrate such as Si or SiC is suitable for this purpose.

As above, the preferable substrate temperature is from 600 to 1500° C. However, in some cases, the substrate temperature can be reduced by adding an energy other than thermal energy to the substrate so as to assist the random motion of surface atom or by removing undesirable surface adsorbates from the substrate. For example, a technique of irradiating the surface of the substrate with a light may be used to add the energy other than thermal energy to the substrate. A usable light source may include a mercury lamp, halogen lamp and ultraviolet laser.

In the CVD method, undesirable attachment of a raw material on a terrace can be prevented, for example, by inducing atomic-layer growth mode.

By employing the above techniques, the Ga$_2$O$_3$-based ultraviolet-transparent conductive film can be obtained even under a substrate temperature of less than 600° C. In particular, a film forming method based on the MO-CVD method can facilitate reducing the substrate temperature.

EXAMPLE

The present invention will be described in detail in conjunction with the following Examples.

Inventive Examples 1 to 3, Comparative Examples 1 to 3

An YSZ single-crystal substrate was installed in a laser-ablation ultra-high vacuum chamber (St-1200 G made by IRIE KOKEN CO., LTD). Then, the substrate is heated by an IR lamp heater, and oxygen gas having a partial pressure of 0 to 2 Pa was introduced into the chamber. For each of Inventive Examples 1 to 3 and Comparative Examples 1 to 3, a substrate temperature and an oxygen partial pressure are set as shown in Table 1.

A high-purity Ga$_2$O$_3$ target containing 3 mol % of SnO$_2$ as a dopant was used in each of Inventive Examples 1 to 3 and Comparative Examples 1 to 3. $Ga_2O_3$ was deposited on the YSZ single-crystal substrate opposed to the target at a distance of 30 mm by irradiating the target with an ArF excimer laser beam (a laser made by Lambda Physic AG). A resulting film has a thickness of 200 nm.

Through the measurement of the diffractive pattern in the thin film using an X-ray diffractometer (RINT made by RIGAKU CORPORATION), it was verified that no $SnO_2$ phase was deposited. A transmittance spectrum and conductivity of the thin film were measured by using an ultraviolet/visual spectrophotometer (U-4000 made by Hitachi, Ltd.) and a 4-terminal method (self-produced), respectively. The measurement results of the average transmittance in the wavelength range of 1000 to 250 nm, the light transmittance at 248 nm which is a wavelength of the KrF excimer laser light, and the conductivity are shown in Table 1.

TABLE 1

|  | Substrate temperature (° C.) | Oxygen partial pressure (Pa) | Average transmittance (%) | Light transmittance at 248 nm (%) | Conductivity (S/cm) |
| --- | --- | --- | --- | --- | --- |
| Inventive Example 1 | 600 | $1 \times 10^{-4}$ | 93 | 15 | $1 \times 10^{-3}$ |
| Inventive Example 2 | 900 | $1 \times 10^{-4}$ | 92 | 30 | 0.5 |
| Inventive Example 3 | 1000 | $1 \times 10^{-4}$ | 91 | 40 | 3 |
| Comparative Example 1 | 300 | $1 \times 10^{-4}$ | 91 | 2 | no conductivity |
| Comparative Example 2 | 500 | $1 \times 10^{-4}$ | 92 | 2 | no conductivity |
| Comparative Example 3 | 900 | 2 | 93 | 5 | no conductivity |

Example 4

A silica glass substrate was installed in the laser-ablation ultra-high vacuum chamber. Then, the substrate is heated in the range of 700 to 900° C. by the IR lamp heater, and oxygen gas having a partial pressure in the range of $1 \times 10^{-5}$ to $1 \times 10^{-3}$ Pa was introduced into the chamber. A high-purity $Ga_2O_3$ containing 1 mol % of $SnO_2$ as a dopant was used as a target, and $Ga_2O_3$ was deposited on the silica glass substrate opposed to the target at a distance of 30 mm by irradiating the target with the ArF excimer laser beam. A resulting film has a thickness of about 100 nm.

A conductivity of the thin film with respect to the substrate temperature and oxygen partial pressure is shown in FIG. 1 as a contour diagram. The horizontal axis, vertical axis and contour indicate the substrate temperature, the common logarithm value of the oxygen partial pressure and the common logarithm value of the conductivity, respectively. At a substrate temperature of 750° C., the conductivity is sensitive to the oxygen partial pressure, and the conductivity is apt to be increased as the oxygen partial pressure is reduced. As the substrate temperature is increased, an oxygen partial pressure dependence of the conductivity is reduced, and a relatively high conductivity is obtained in a wide oxygen partial pressure range.

Example 5

Figure 2:
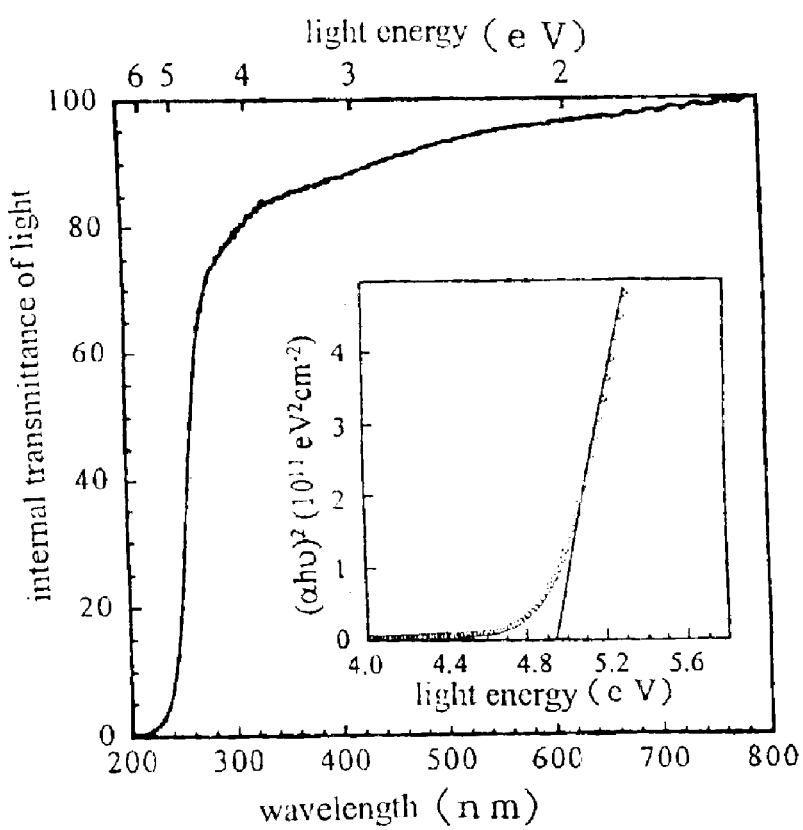
FIG. 2 is a contour diagram showing a conductivity of a $Ga_2O_3$ thin-film obtained from Example 5.

As in Example 4, $Ga_2O_3$ was deposited on a silica glass substrate. Under the conditions with a substrate temperature of 880° C. and an oxygen partial pressure of $6 \times 10^{-5}$ Pa, a β-$Ga_2O_3$ thin-film having a conductivity of 1.0 S/cm was obtained. This thin film has a mobility of 0.44 $cm^2$/Vs and a carrier density of $1.4 \times 10^{19}$/$cm^3$. A light transmittance spectrum of the thin film is shown in FIG. 2. The horizontal and vertical axes indicate the wavelength of light and the internal transmittance (int) of light, respectively.

The term "internal transmittance" means a light transmittance in which the contribution of the light reflection on the surface of the thin film is removed therefrom; or a value calculated based on the formula T(int)=T(obs)/(100−R(obs)) using a light transmittance T(obs) and a reflectance R(obs) measured by the ultraviolet/visible spectrophotometer; or a percentage ratio of a transmitted light through the thin film to an original light incident in the thin film.

The internal transmittance is kept at a value of 80% or more from the visible light region to the near-ultraviolet light region, and sharply reduced at about 250 nm. The inserted diagram is reconstructed from FIG. 2, showing $(\alpha h v)^2$ as a function of light energy, wherein α is an absorption coefficient, h is a Planck constant, and v is a light energy. The optical bandgap of the thin film was estimated as 4.9 eV based on an x-intercept of a tangent line. The light transmittance and the internal transmittance at 248 nm or the wavelength of the KrF excimer laser light were 45% and 55%, respectively. These values are sufficient, for example, as a transmittance of a halftone layer for a phase-shift mask in a patterning process using a KrF excimer laser.

INDUSTRIAL APPLICABILITY

The present invention achieves a $Ga_2O_3$-based transparent conductive film allowing transmission of deep/near-ultraviolet and visible lights having a wavelength of 240 nm or more. The transparent conductive film brings out excellent properties in various applications such as transparent electrodes for ultraviolet-light-emitting devices, ultraviolet solar cell or biomaterial analyzers, or antistatic films for ultraviolet laser processing machines.

What is claimed is:

1. An ultraviolet-transparent conductive film comprising a $Ga_2O_3$ crystal formed through any one of a pulsed-laser vapor deposition method, sputtering method, CVD method and MBE method, said film having a transparency throughout the wavelength range of 240 to 800 nm, and an electric conductivity induced by an oxygen deficiency or dopant incorporated in said $Ga_2O_3$ crystal.

2. An ultraviolet-transparent conductive film comprising a $Ga_2O_3$ crystal formed through any one of a pulsed-laser vapor deposition method, sputtering method, CVD method and MBE method, said film having a transparency throughout the wavelength range of 240 to 400 nm, and an electric conductivity induced by an oxygen deficiency or dopant incorporated in said $Ga_2O_3$ crystal.

3. The ultraviolet-transparent conductive film as defined in claim 1 or 2, wherein said dopant includes at least one element selected from the group consisting of the Sn, Ge, Si, Ti, Zr, Hf, V, Nb, Ta, Cr, Mo and W.

4. The ultraviolet-transparent conductive film as defined in claim 1 or 2, which has a transmittance of 4% or more at a wavelength of 248 nm.

5. The ultraviolet-transparent conductive film as defined in claim 1 or 2, which has a light transmittance of 15% or more at a wavelength of 248 nm.

6. The ultraviolet-transparent conductive film as defined in claim 1 or 2, which has a light transmittance of 30% or more at a wavelength of 248 nm.

7. A method of preparing an ultraviolet-transparent conductive film comprising a $Ga_2O_3$ crystal, comprising a step of forming said film through any one of a pulsed-laser vapor deposition method, sputtering method, CVD method and MBE method, under the conditions with a substrate temperature of 600 to 1500° C. and an oxygen partial pressure of 0 to 1 Pa.

8. A method of preparing an ultraviolet-transparent conductive film comprising a $Ga_2O_3$ crystal, said method comprising forming said film through any one of a pulsed-laser vapor deposition method, sputtering method, CVD method and MBE method, under the conditions with a substrate temperature of less than 600° C. and an oxygen partial pressure of 0 to 1 Pa while adding an energy other than thermal energy to the substrate.

9. A method of preparing an ultraviolet-transparent conductive film comprising a $Ga_2O_3$ crystal, said method comprising forming said film through either one of a pulsed-laser vapor deposition method, spattering method, CVD method and MBE method, under the conditions with a substrate temperature of less than 600° C. and an oxygen partial pressure of 0 to 1 Pa while removing undesirable surface adsorbates from the substrate.

10. An ultraviolet-transparent conductive film comprising a $Ga_2O_3$ crystal formed through any one of a pulsed-laser vapor deposition method, sputtering method, CVD method and MBE method, said film having a transparency in the wavelength range of 240 to 400 nm, and an electric conductivity induced by an oxygen deficiency or dopant incorporated in said $Ga_2O_3$ crystal, which has a transmittance of 4% or more at a wavelength of 248 nm.

11. An ultraviolet-transparent conductive film as in claim 10, wherein said dopant includes at least one element selected from the group consisting of the Sn, Ge, Si, Ti, Zr, Hf, V, Nb, Ta, Cr, Mo and W.

* * * * *